(12) United States Patent
Ito et al.

(10) Patent No.: US 8,436,777 B2
(45) Date of Patent: May 7, 2013

(54) MEASUREMENT APPARATUS AND METHOD THEREOF

(75) Inventors: Takayoshi Ito, Kanagawa-ken (JP);
Yukako Tsutsumi, Kanagawa-ken (JP);
Shuichi Obayashi, Kanagawa-ken (JP);
Hiroki Shoki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 681 days.

(21) Appl. No.: 12/654,848

(22) Filed: Jan. 6, 2010

(65) Prior Publication Data
US 2010/0171669 A1    Jul. 8, 2010

(30) Foreign Application Priority Data
Jan. 6, 2009   (JP) .............................. P2009-000762

(51) Int. Cl.
*G01R 29/10* (2006.01)
(52) U.S. Cl.
USPC .......................................................... 343/703
(58) Field of Classification Search .................... 343/703
See application file for complete search history.

(56) References Cited

FOREIGN PATENT DOCUMENTS

| | | |
|---|---|---|
| JP | 60-256071 | 12/1985 |
| JP | 05-133989 | 5/1993 |
| JP | 2001-133495 | 5/2001 |
| JP | 2004-233249 | 8/2004 |
| JP | 2006-053010 | 2/2006 |
| JP | 2007-271317 | 10/2007 |
| JP | 2008-032692 | 2/2008 |

OTHER PUBLICATIONS

Office Action dated Sep. 28, 2012 in Japanese Application No. 2009-00762 and English-language translation thereof.
Office Action dated Dec. 4, 2012 in Japanese Patent Application No. 2009-000762 with English-language translation.

*Primary Examiner* — Jacob Y Choi
*Assistant Examiner* — Hasan Islam
(74) *Attorney, Agent, or Firm* — Nixon & Vanderhye, P.C.

(57) ABSTRACT

A measurement apparatus includes an anechoic chamber, a DUT board, rotation units, and a feeding arm. The anechoic chamber has inner-walls. Each inner-wall is covered with a radio wave absorber. One of the inner-wall is a first wall with an aperture and the other inner-walls are second walls. The DUT board holds a first antenna to be measured with radiation property and a probe to detect a signal from the first antenna. A part of the DUT board is inserted into the anechoic chamber through the aperture opened in the first wall. One end of the feeding arm holds a second antenna radiating a radio wave to the first antenna in the anechoic chamber. Each rotation unit provides on each second wall and is selectively attached to the other end of the feeding arm for rotating the second antenna and for feeding to the second antenna.

14 Claims, 21 Drawing Sheets

MEASUREMENT APPARATUS AND METHOD THEREOF

CROSS-REFERENCE TO RELATED APPLICATIONS

This application is based upon and claims the benefit of priority from the Japanese Patent Application. No. 2009-000762, filed on Jan. 6, 2009, the entire contents of which are incorporated herein by reference.

BACKGROUND OF THE INVENTION

1. Field of the Invention

The present invention relates to a measurement apparatus and a method thereof.

2. Description of the Related Art

One of the techniques to measure radiation property of an antenna in three dimension is disclosed in JP-A 2004-7233249 (KOKAI). In this reference, an antenna to be measured rotates in an anechoic chamber.

However, when the antenna has a fine feeding structure such as being fed by a probe, it is difficult for the antenna to rotate connecting a needle of the probe into a chip implemented the antenna.

Other technique to measure radiation property is disclosed in JP-A 2006-53010 (KOKAI). In this reference, the antenna is fixed and connected to the probe. Moreover, an arch bridges over the antenna. The arch has a measuring antenna and rotates around the antenna. The measuring antenna transmits/receives radio wave to/from the antenna in order to measure radiation property of the antenna.

However, the antenna has a plural of panes and the radiation property of the antenna needs to be measured in each of the panes. When the radiation properties are measured with changing the pane of the antenna in the several measurements, the probe needs to be removed from the antenna and fixed on a plate, and then the probe is reconnected to the chip in each measuring of each of the panes.

Moreover, a same condition has to be replicated in all measuring in order to regard a measured data as an objective data.

As a result, labor effectiveness degrades because operation is complex and has to be performed carefully.

Described above, it is difficult for the antenna, which is fixed in the anechoic chamber and fed by the probe, to measure the radiation properties about the plural of panes.

SUMMARY OF THE INVENTION

According to one aspect of the invention, a measurement apparatus includes
   an anechoic chamber having a plurality of inner-walls, each being covered with a radio wave absorber, one of the inner-wall being a first wall with an aperture and the other inner-walls being second walls;
   a DUT (Device Under Test) board to hold a first antenna to be measured with radiation property and a prove to detect a signal from the first antenna, at least a part of the DUT board being inserted into the anechoic chamber through the aperture opened in the first wall;
   a feeding arm, one end holding a second antenna radiating a radio wave to the first antenna in the anechoic chamber; and
   a plurality of rotation units, each provided on each of the second walls and being selectively attached to the other end of the feeding arm for rotating the second antenna and for feeding to the second antenna.

According to other aspect of the invention, a method for a measurement apparatus including an anechoic chamber which inside being covered with radio wave absorber, a DUT (Device Under Test) board which is inserted, into the anechoic chamber through an aperture opened in a first plane of the anechoic chamber, a probe hold which is placed on the DUT board and holds a probe feeding, rotation units, each being formed in one of planes of the anechoic chamber except the first plane, each being rotatable, and a feeding arm, one end being attached into and removed from the rotation units, other end holding an antenna, feeding to the antenna, comprising:
   setting a first antenna on the DUT board;
   setting a second antenna on the other end of the feeding arm;
   attaching the one end of the feeding arm into a first rotation unit;
   touching the probe to the first antenna;
   transmitting a signal from the second antenna with rotating the first rotation unit;
   receiving the signal at the first antenna;
   attaching the one end of the feeding arm into a second rotation unit;
   transmitting the signal from the second antenna with rotating the second rotation unit; and
   receiving the signal at the first antenna.

DETAILED DESCRIPTION OF THE INVENTION

The embodiments will be explained with reference to the accompanying drawings.

(Description of the First Embodiment)

Figure 1:
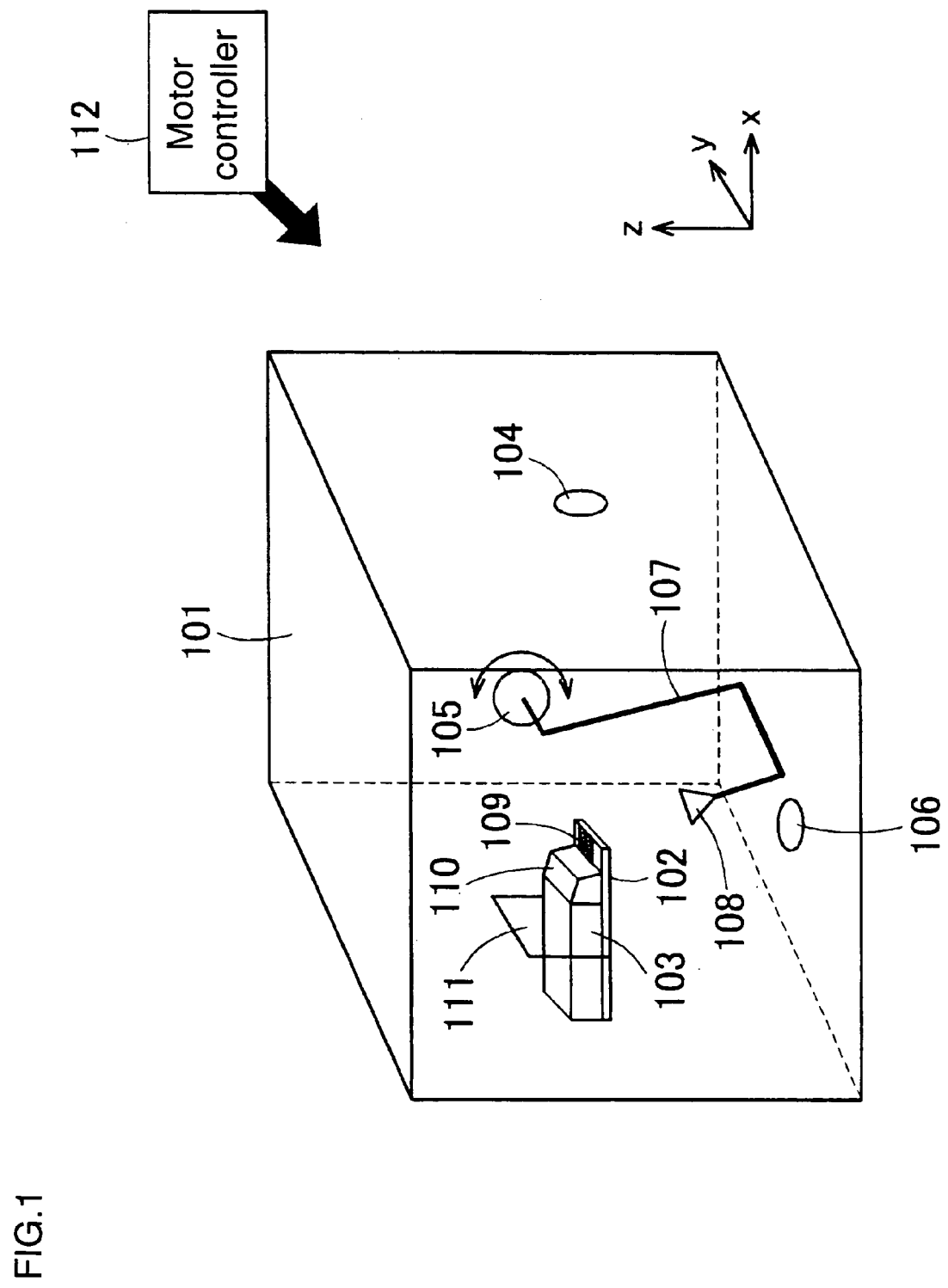
FIG. 1 is a perspective view showing a measurement apparatus according to the first embodiment.

As shown in FIG. 1, a measurement apparatus includes an anechoic chamber 101, a DUT (Device Under Test) board 102, a probe hold 103, rotation units 104-106, and a feeding arm 107.

The anechoic chamber 101 has a plural of walls (six walls exist in FIG. 1). Each wall is covered with radio wave absorber (not shown). The radio wave absorber may be made of urethane absorbing carbon. The radio wave absorber may have a wave-shaped or a pyramid-shaped on its surface. An aperture 111 is opened at an almost center of one of the walls. The several walls (three walls in FIG. 1) have the rotation units 104-106, respectively. The rotation units 104-106 can hold the feeding arm 107. At least one wall has a door (not shown) which is able to be opened and closed. Size of the anechoic chamber 101 depends on a frequency of radio wave.

The DUT board 102 is placed as that a part of the DUT board 102 is inserted into the anechoic chamber 101 through the aperture 111. The DUT board 102 holds a measured antenna (first antenna) 109 on its tip in the anechoic chamber 101. The measured antenna 109 can be placed on the DUT board 102 through the door.

The probe hold 103 is placed on the DUT board 102, and holds a probe 110. The probe 110 feeds a signal to the measured antenna 109. The measured antenna 109 may be an on-chip antenna or a bonding-wire antenna.

Figure 2:
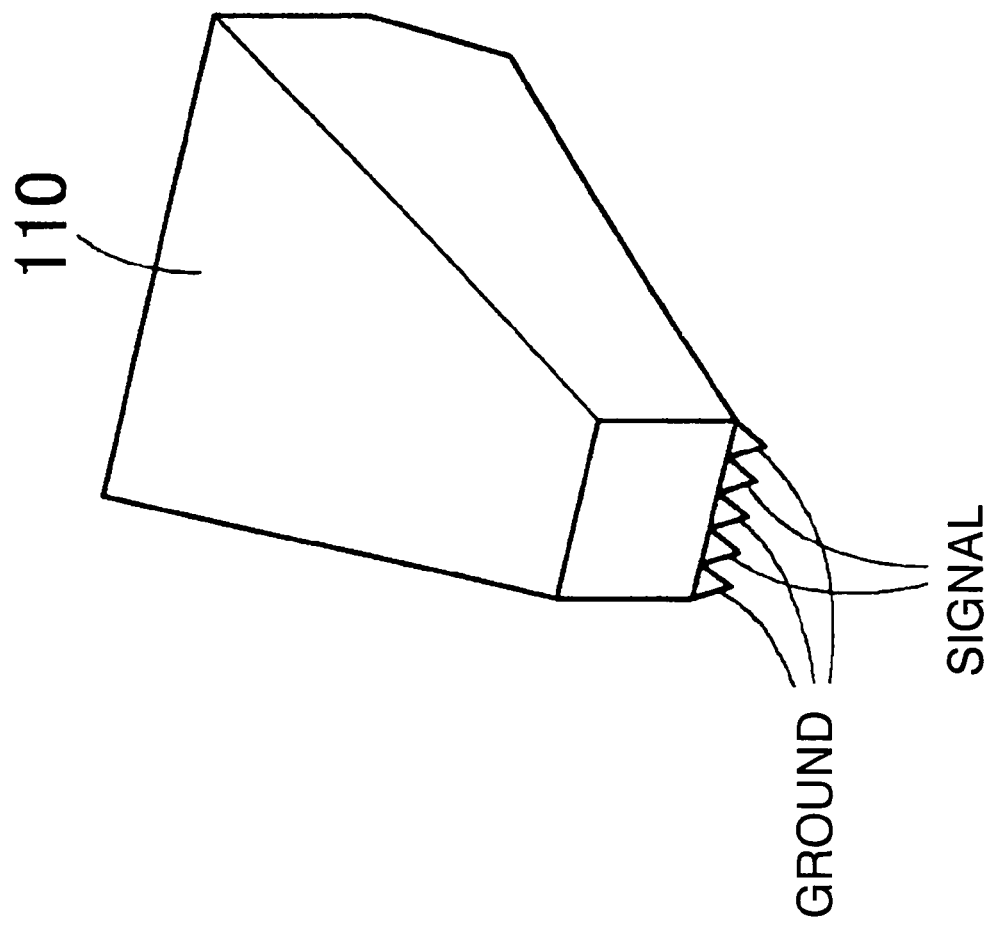
FIG. 2 is a perspective view showing a probe.
Figure 3:
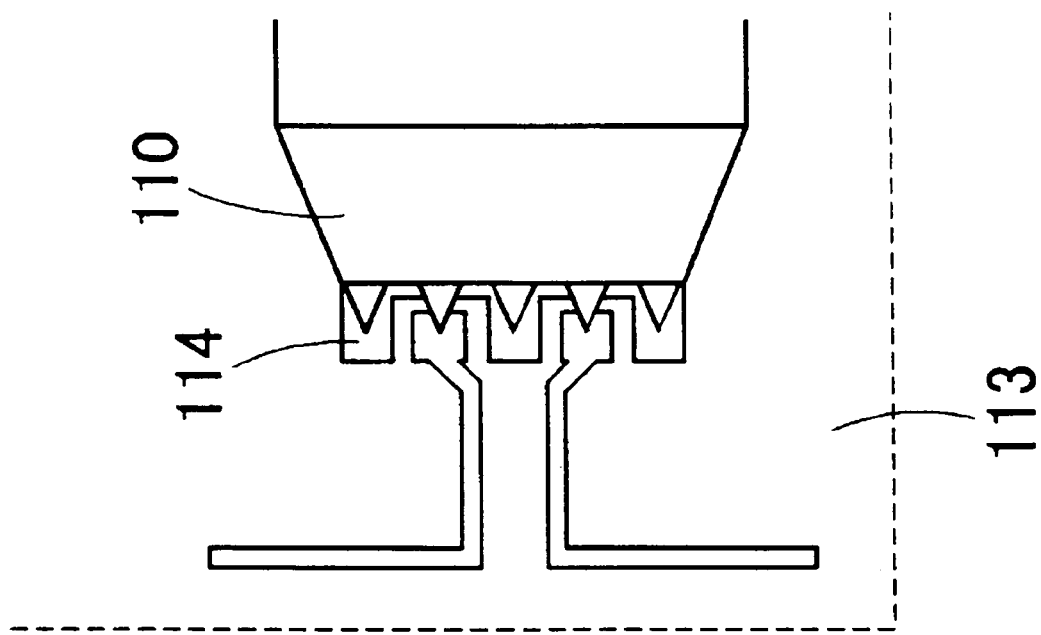
FIG. 3 is a diagram showing that the probe is attached to a contact pad on a chip.

As shown in FIG. 2, needles are lined along the tip of the probe 110 to feed. Some of the needles correspond to a ground level and the others correspond to a signal level. As shown in FIG. 3, the needles are attached to a contact pad 114 which is formed on a semiconductor chip 113. The measured antenna 109 is implemented into the semiconductor chip 113. The semiconductor chip 113 and the measured antenna 109 are fed from the contact pad 114.

One end of the feeding arm 107 is attached into and removed from the rotation units 104-106. The other end of the feeding arm 107 is connected to a measuring antenna (second antenna) 108 and feeds to the measuring antenna 108. The feeding arm 107 has a crank-shaped along the walls inside the anechoic chamber 101 as shown in FIG. 1. The feeding arm 107 is connected to any one of the rotation units 104-106. The feeding arm 107 can be reconnected to another of the rotation units 104-106 through the door of the anechoic chamber 101.

Figure 4:
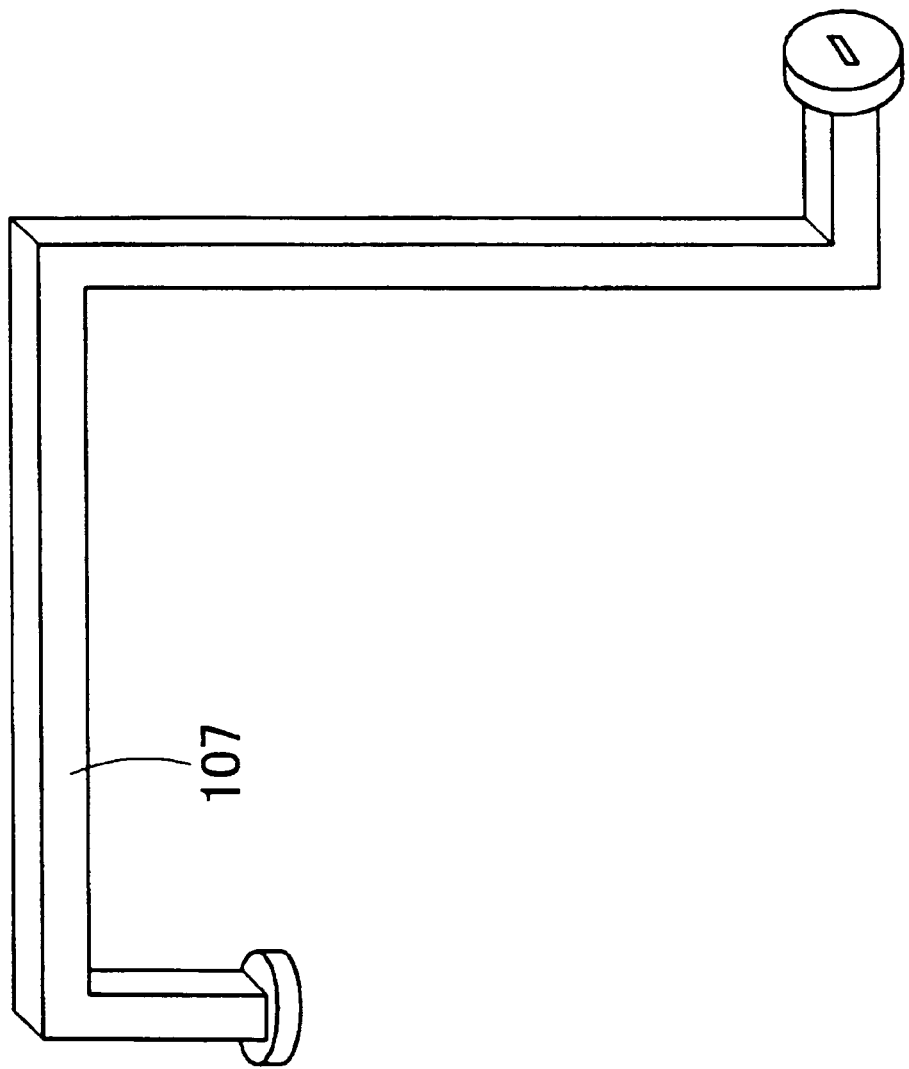
FIG. 4 is a perspective view showing a feeding arm.

As shown in FIG. 4, the feeding arm 107 may be formed by a waveguide. The waveguide made of metal is suitable to support the measuring antenna 108. Since the waveguide has small loss, measuring dynamic range can be improved especially in a high frequency band such as millimeter wave band.

The measuring antenna 108 may be a horn antenna.

Figure 5:
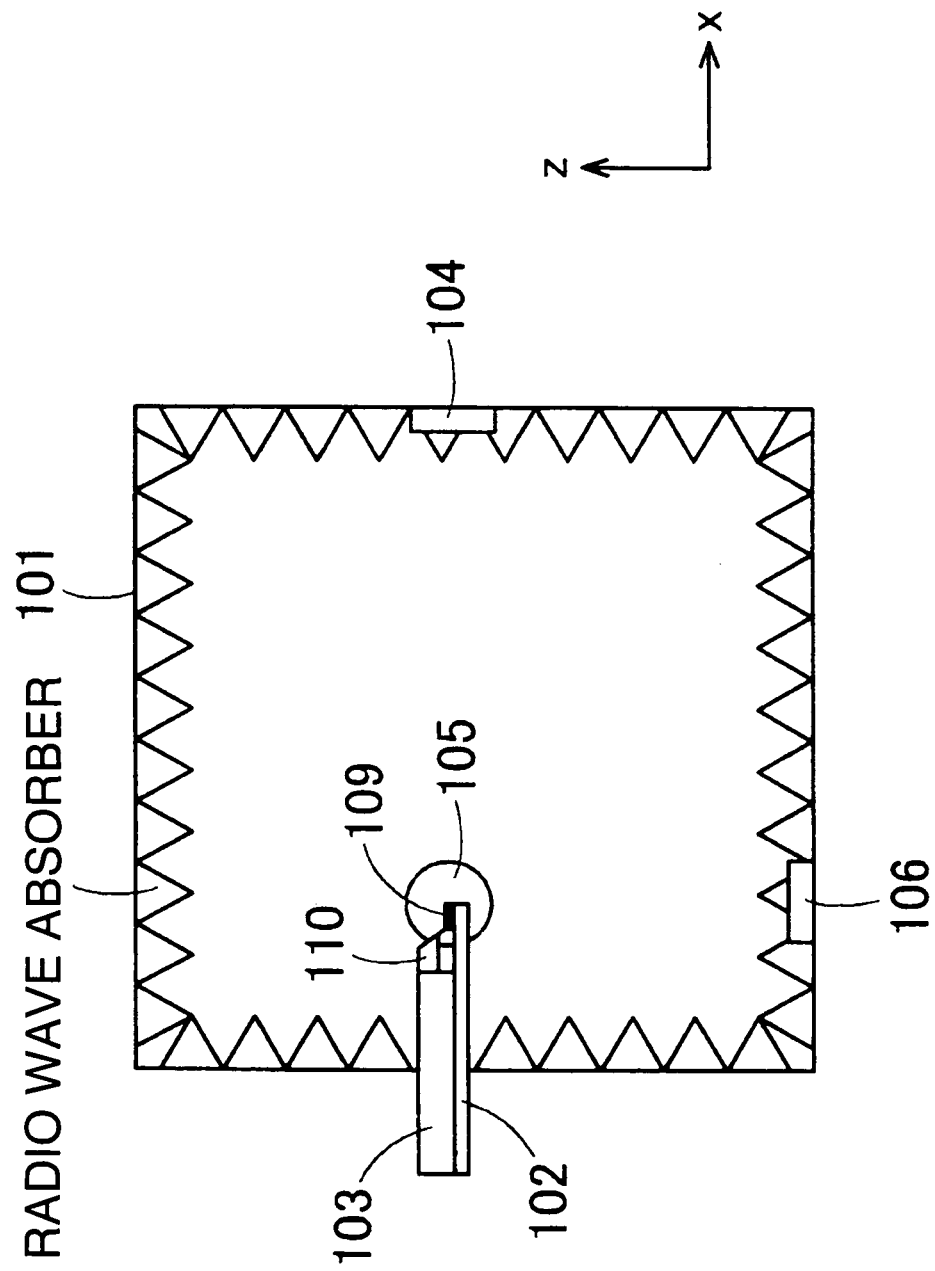
FIG. 5 is a cross sectional view along a xz-plane of the FIG. 1.

The rotation units 104-106 are connected to motors (not shown), respectively. Then, the rotation units 104-106 are rotated by the motors which are controlled by a motor controller 112. The motor controller 112 is placed outside the anechoic chamber 101. The rotation units 104-106 are formed at locations as that the measured antenna 109 is located on a rotation axis of the motor. FIG. 5 is a cross sectional view of the anechoic chamber 101 along a xz-plane of FIG. 1. For example, the rotation units 104-106 and the measured antenna 109 are located as shown in FIG. 5. The rotation axis of the rotation units 105 is parallel to a y-axis.

Figure 6:
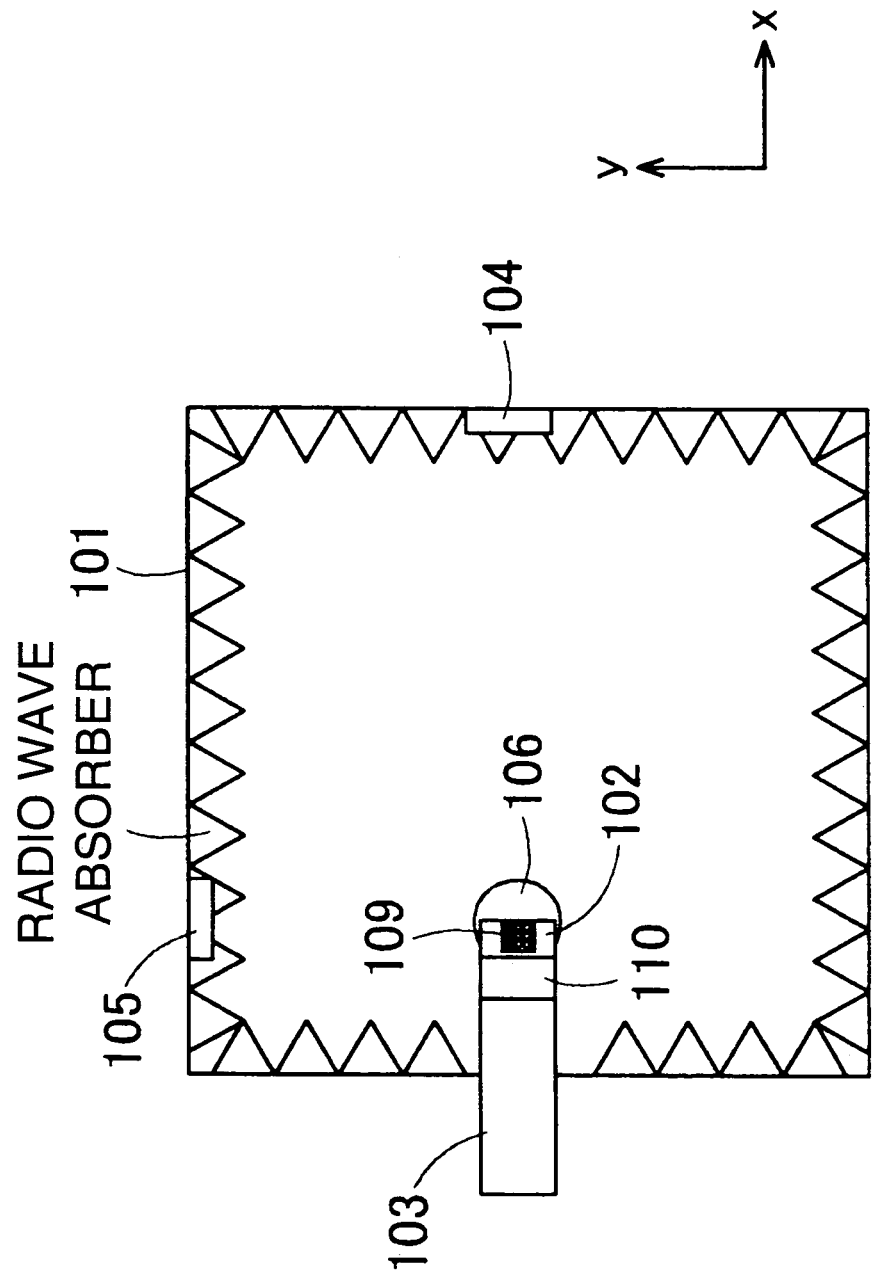
FIG. 6 is a cross sectional view along a xy-plane of the FIG. 1.

FIG. 6 is a cross sectional view of the anechoic chamber 101 along a xy-plane of FIG. 1. The rotation units 104-106 and the measured antenna 109 are also located as shown in FIG. 6. The rotation axis of the rotation units 106 is parallel to a z-axis.

Figure 7:
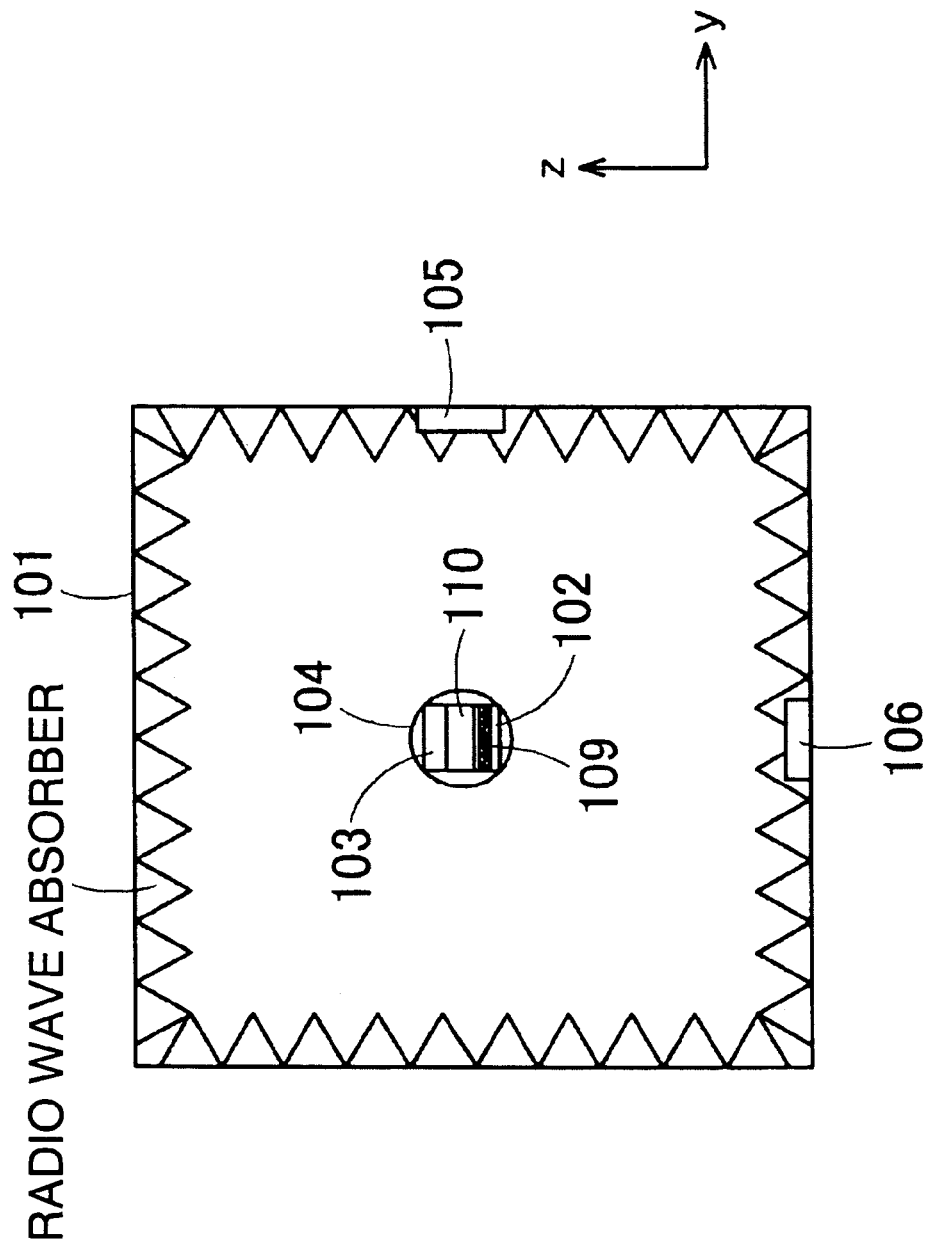
FIG. 7 is a cross sectional view along a yz-plane of the FIG. 1.

Similarly, FIG. 7 is a cross sectional view of the anechoic chamber 101 along a yz-plane of FIG. 1. The rotation units 104-106 and the measured antenna 109 are also located as shown in FIG. 7. The rotation axis of the rotation units 104 is parallel to a x-axis.

Since the probe 110 and the probe hold 103 are located at back of the measured antenna 109, measuring accuracy degrades in the back of the measured antenna 109. Therefore, the rotation units 105, 106 may be placed at positions which are closer to the DUT board 102 from center of the anechoic chamber 101. This realizes an easy setting of the measured antenna 109 to the DUT board 102. Moreover, production cost and setting space can be reduced.

Figure 8:
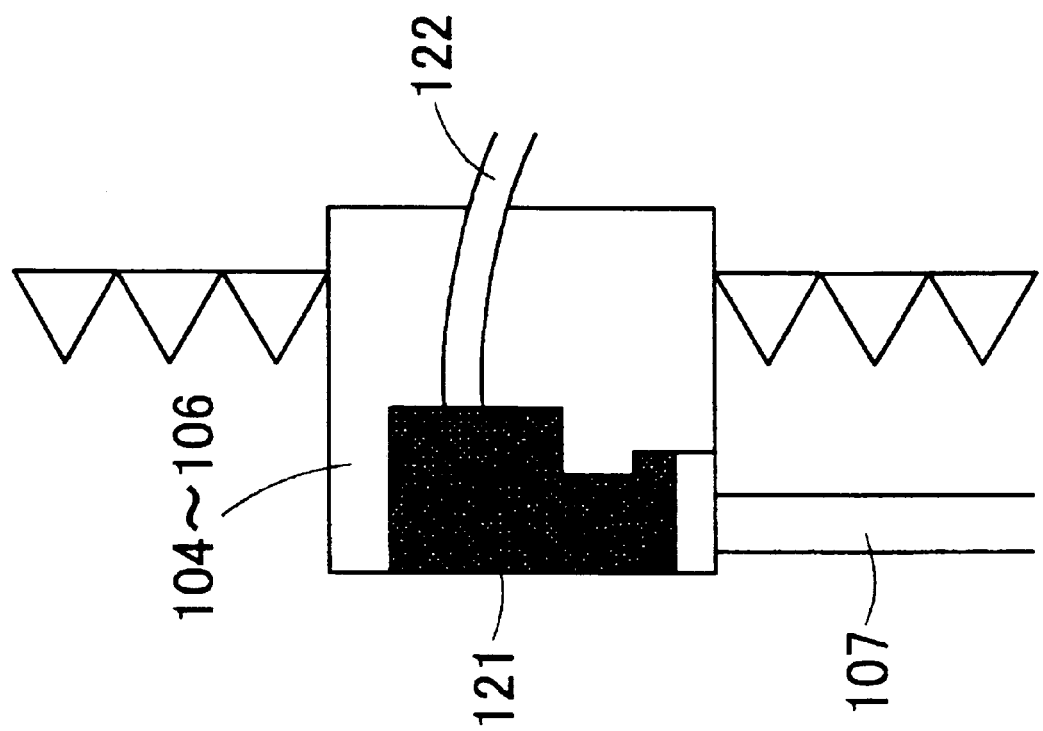
FIG. 8 is a diagram showing an example of a rotation unit.

The rotation units 104-106 can be connected to the feeding arm 107 inside the anechoic chamber 101 and other device outside the anechoic chamber 101. As shown in FIG. 8, the rotation units 104-106 may have a coaxial waveguide transformer 121. The coaxial waveguide transformer 121 is fixed to each of the rotation units 104-106, and connects the feeding arm (waveguide) 107 inside the anechoic chamber 101 with a coaxial cable 122 outside the anechoic chamber 101. The coaxial waveguide transformer 121 is larger and hard to bend compared with the waveguide. Therefore, the coaxial waveguide transformer 121 can be firmly fixed into the rotation units 104-106.

Figure 9:
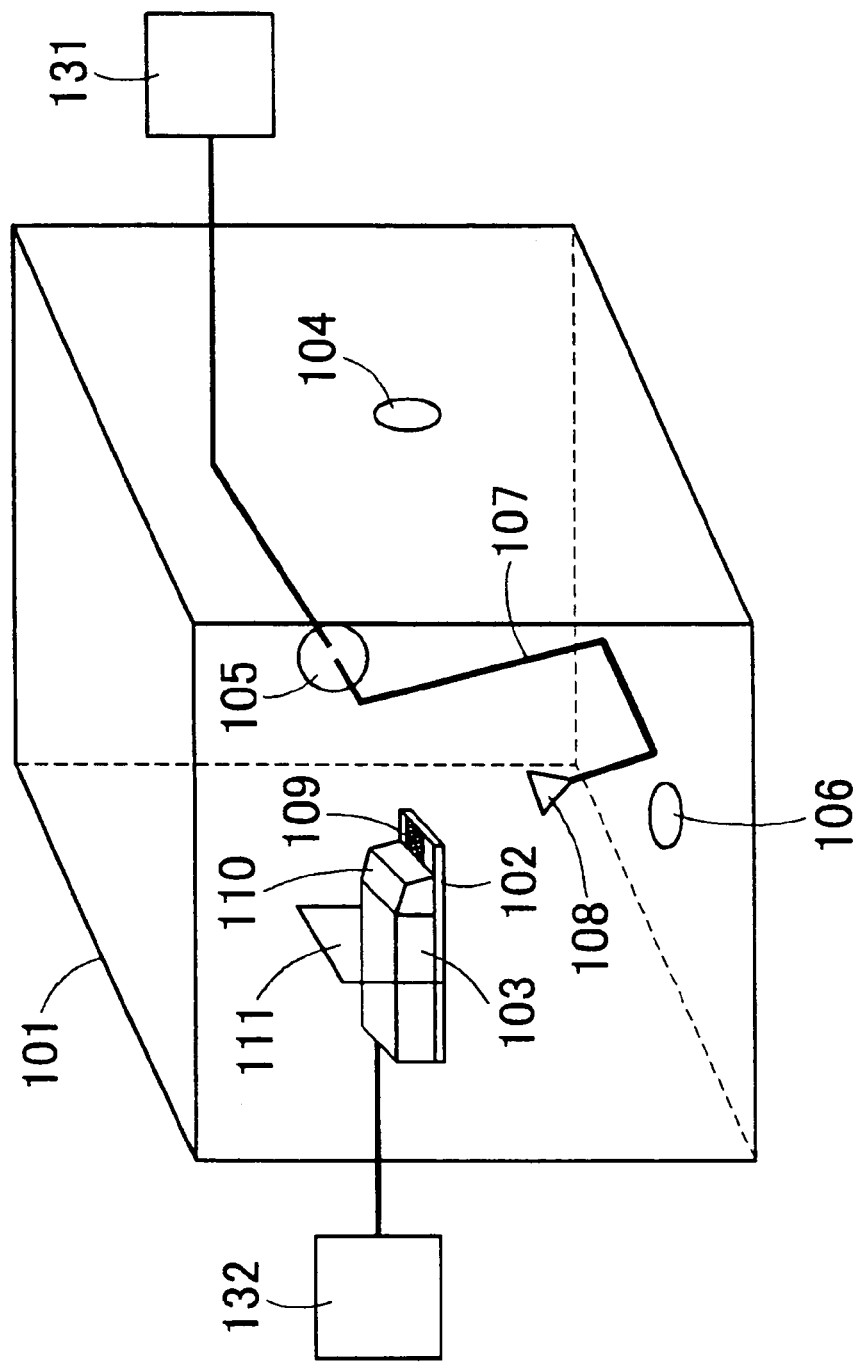
FIG. 9 is a perspective view showing the measurement apparatus.

As shown in FIG. 9, the feeding arm 107 is connected to a signal generator 131 through any one of the rotation units 104-106 and the probe 110 is connected to a spectrum analyzer 132 in order to measure the radiation property of the measured antenna 109. Then, a signal generated by the signal generator 131 is transmitted from the measuring antenna 108 rotating the rotation units 104-106. The signal received by the measured antenna 109 is analyzed by the spectrum analyzer 132.

Figure 10:
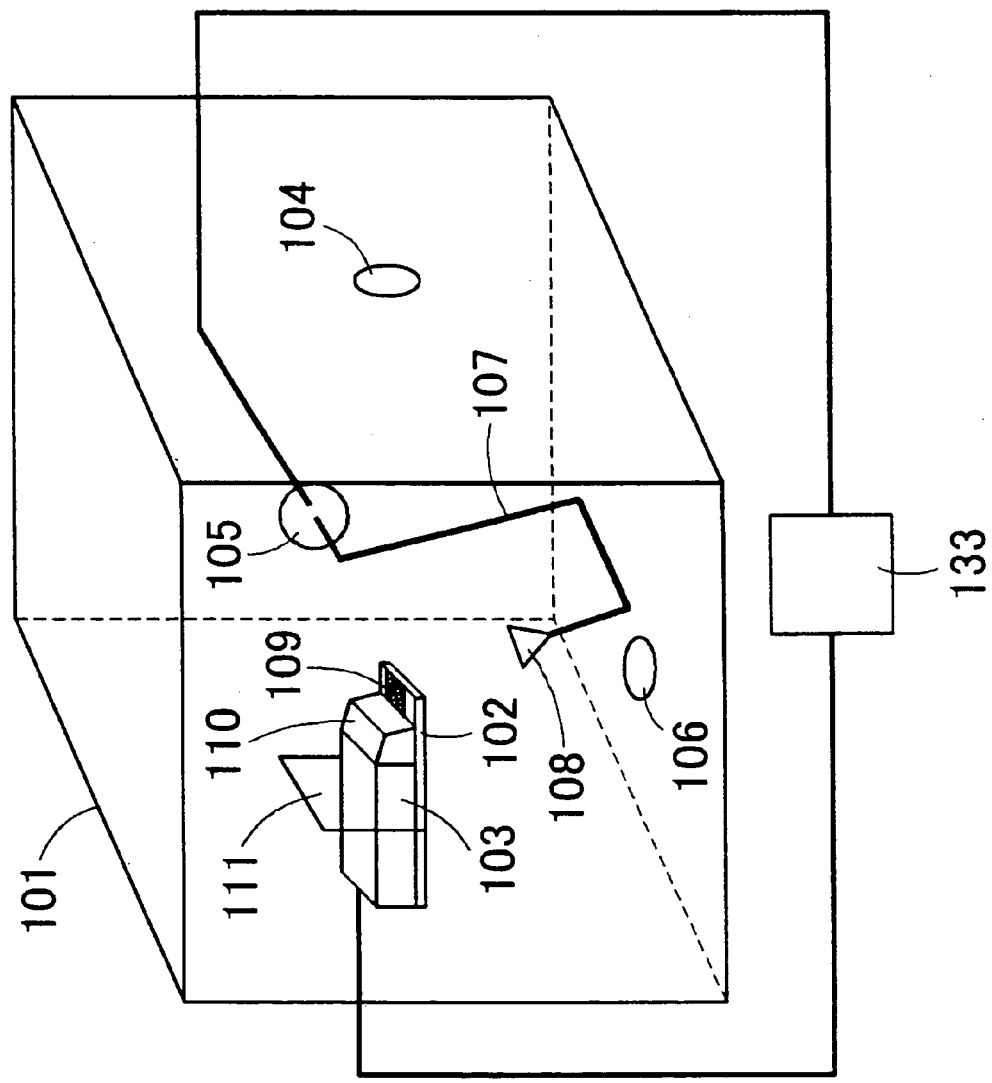
FIG. 10 is a perspective view showing the measurement apparatus.

As shown in FIG. 10, the feeding arm 107 may be connected to a port 1 of a network analyzer 133 through any one of the rotation units 104-106 and the probe 110 may be connected to a port 2 of the network analyzer 133.

Since the feeding arm 107 has the crank-shaped, the measuring antenna 108 rotates around the measured antenna 109 keeping a constant distance between the measuring antenna 108 and the measured antenna 109 during rotation of the feeding arm 107 of which one end is connected to any one of the rotation units 104-106. The radiation properties around the measured antenna 109 can be measured by rotation of the measuring antenna 108. Moreover, the feeding arm 107 can keep being far from the measured antenna 109 in order to reduce giving influence to the measured antenna 109.

The feeding arm 107 can be easily reconnected to another of the rotation units 104-106 through the door of the anechoic chamber 101. Therefore, the radiation properties of different panes can be measured without touching the measured antenna 109.

Figure 11:
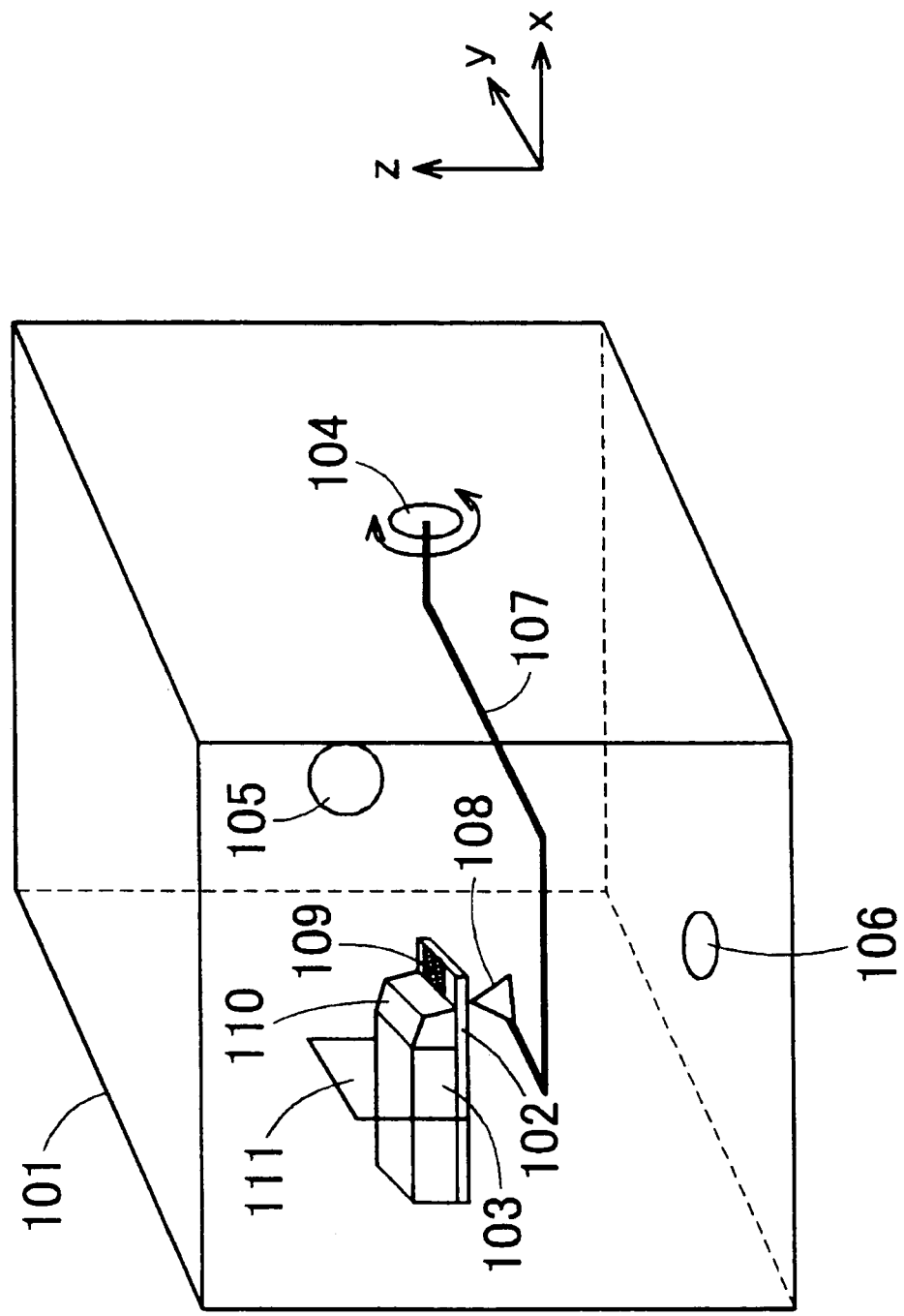
FIG. 11 is a perspective view showing the measurement apparatus.
Figure 12:
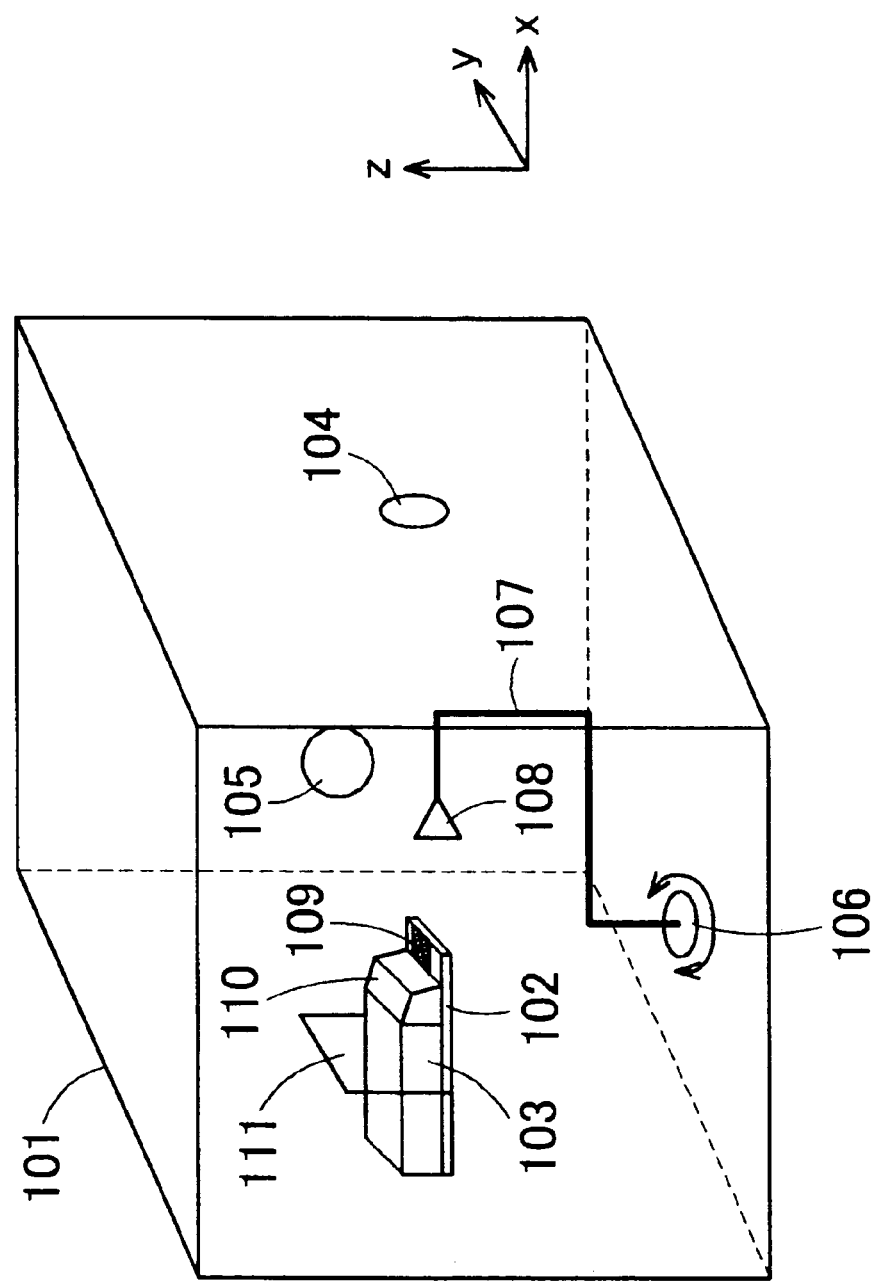
FIG. 12 is a perspective view showing the measurement apparatus.

As show in FIG. 11, the radiation properties in the yz-plane may be measured by rotating the feeding arm 107 of which one end is connected to the rotation unit 104. As show in FIG. 1, the radiation properties in the xz-plane may be measured by rotating the feeding arm 107 of which one end is connected to the rotation unit 105. Similarly, as show in FIG. 12, the radiation properties in the xy-plane may be measured by rotating the feeding arm 107 of which one end is connected to the rotation unit 106.

According to the first embodiment, the measurement apparatus can easily measure the radiation properties for the plural of panes with keeping fixed in the anechoic chamber.

Figure 13:
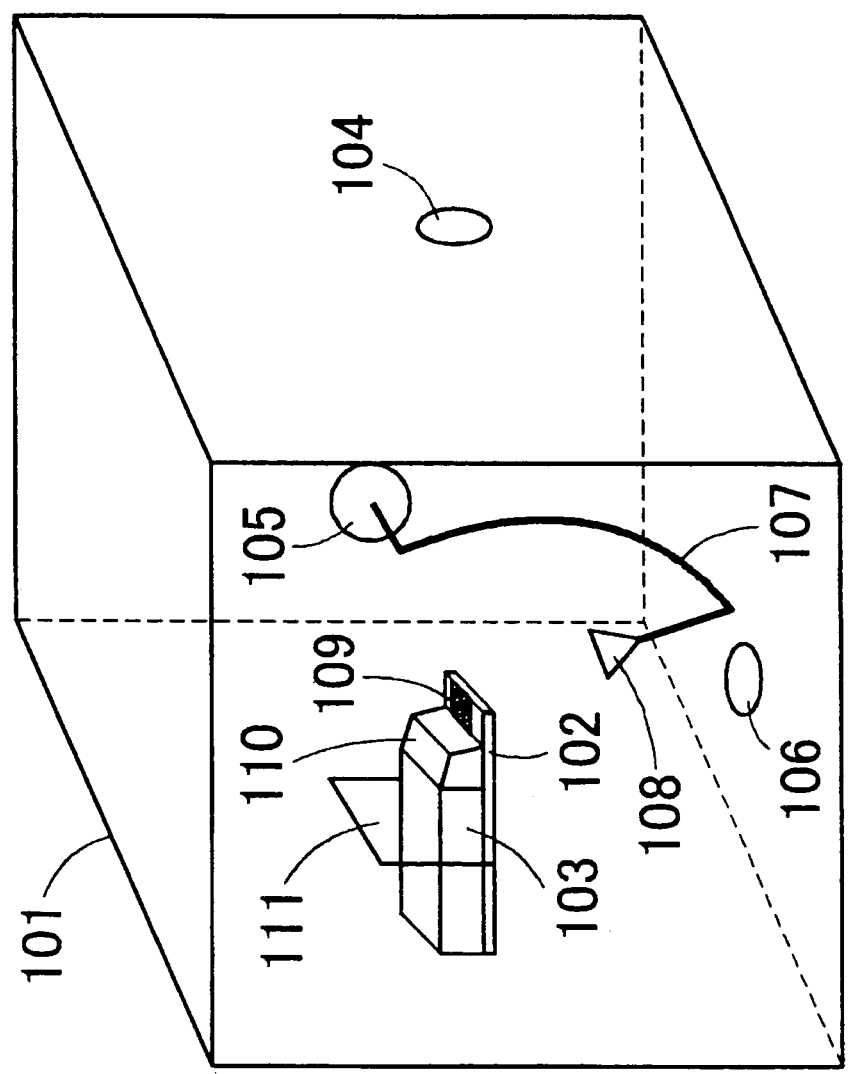
FIG. 13 is a perspective view showing the measurement apparatus using the feeding arm having a circular-shaped.

As shown in FIG. 13, the feeding arm 107 may have a circular-shaped. The feeding arm can also keep a constant distance between the measuring antenna 108 and the measured antenna 109 when the radiation properties around the measured antenna 109 are measured.

The feeding arm 107 may have an U-shaped or other shapes which can keep the constant distance between the measuring antenna 108 and the measured antenna 109.

Figure 14:
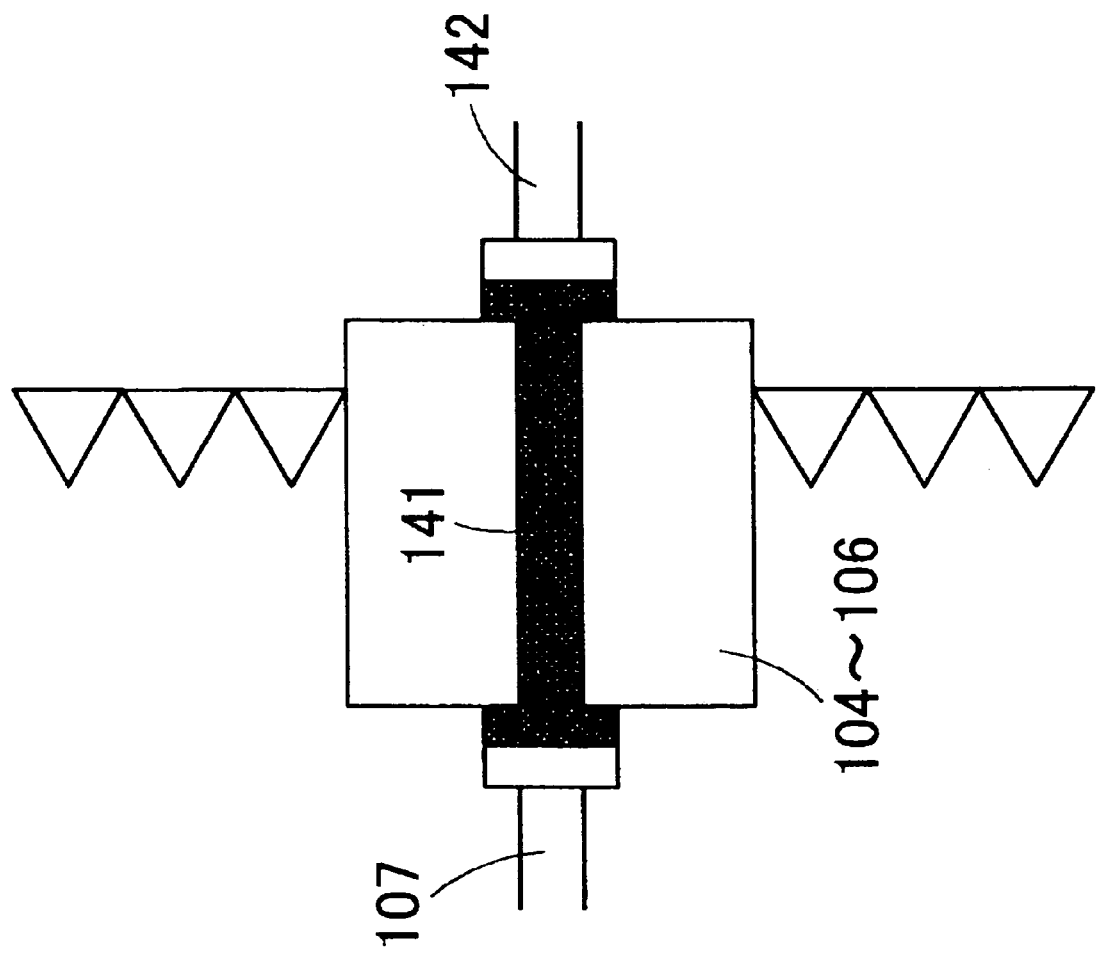
FIG. 14 is a diagram showing an example of the rotation unit.

As shown in FIG. 14, a rotary joint 141 can be used for the rotation units 104-106 in order to connect the feeding arm (waveguide) 107 inside the anechoic chamber 101 with an other device (waveguide) 142 outside the anechoic chamber 101. One side of rotary joint 141 which is faced to inside the anechoic chamber 101 is rotated. On the other hand, the other side of the rotary joint 141 which is faced to outside the anechoic chamber 101 is fixed. Therefore, the rotary joint 141 can reduce distortion of transmission line and variation of electrical performance outside the anechoic chamber 101.

Figure 15:
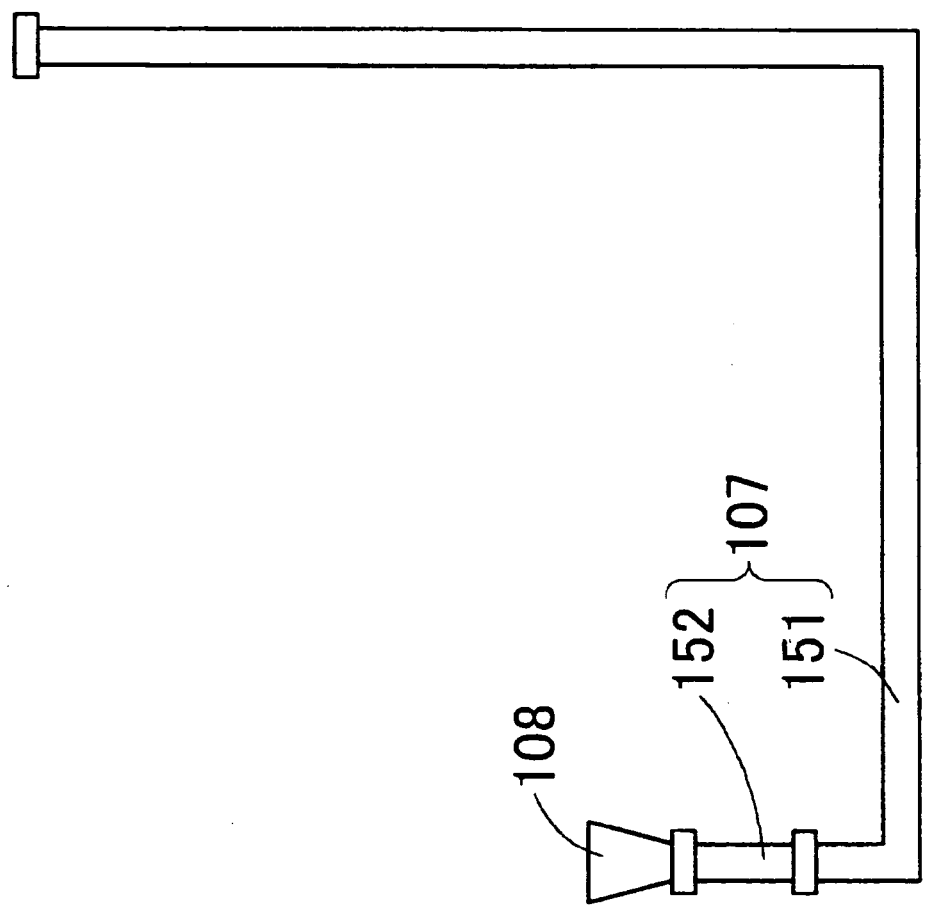
FIG. 15 is a perspective view showing the feeding arm.
Figure 16A:
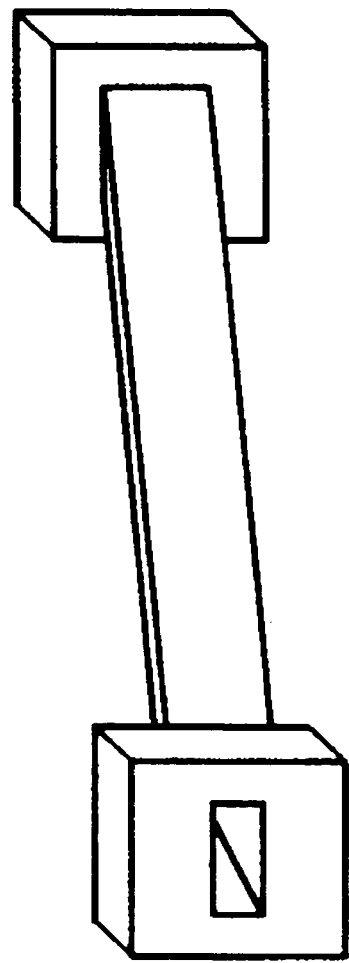
FIG. 16A is a perspective view showing a straight waveguide.
Figure 16B:
FIG. 16B is a perspective view showing a 90-degree twist waveguide.

As shown in FIG. 15, the feeding arm 107 may include a waveguide 151 (first waveguide) and a short waveguide 152 (second waveguide). The waveguide 151 has a crank-shaped. The short waveguide 152 is attached to and removed from a tip of the waveguide 151. The short waveguide 152 may be a straight waveguide as shown in FIG. 16A or a 90-degree twist waveguide as shown in FIG. 16B. Vertical-polarized wave and horizontal-polarized wave can be switched without attaching/removing whole the feeding arm 107 by replacing only the short waveguide 152.

The feeding arm (waveguide) 107 may be connected to the measuring antenna 108 through a rotary joint. The vertical-polarized wave and the horizontal-polarized wave can be switched without attaching/removing whole the feeding arm 107 by rotating the rotary joint.

Figure 17:
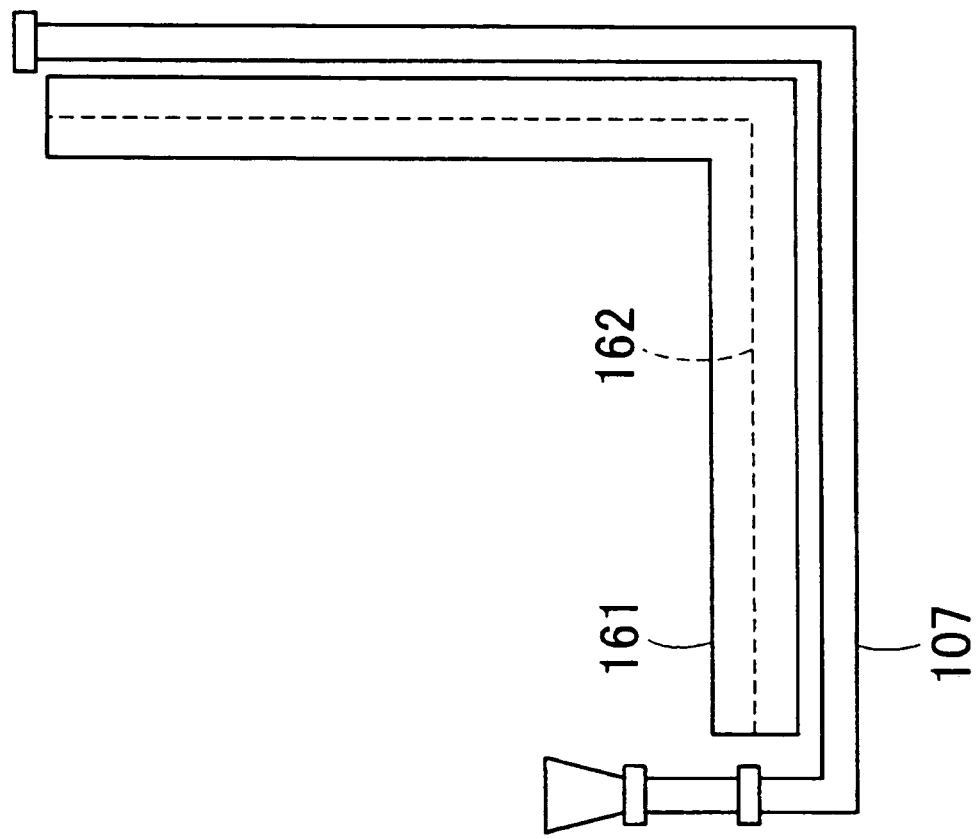
FIG. 17 is a perspective view showing the feeding arm.

As shown in FIG. 17, when the feeding arm 107 is formed by a waveguide, a supporting member 161 may be used to support the waveguide. The waveguide made of metal may be bent by torque at end which is fixed to any one of the rotation units 104-106. However, the supporting member 161 prevents the waveguide from bending. As a result, precision of rotation angle and the distance between the measuring antenna 108 and the measured antenna 109 may not degrade. For example, a concave slot is formed on the supporting member 161 and the feeding arm 107 is matching into the concave slot.

Figure 18:
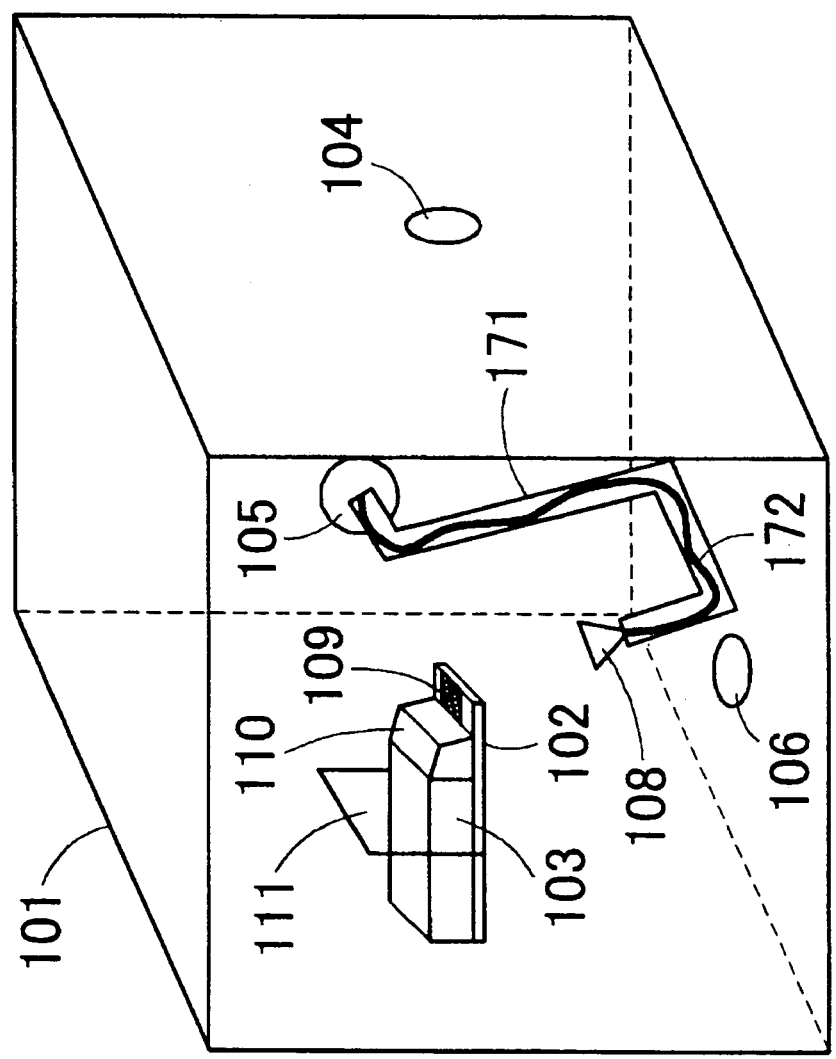
FIG. 18 is a perspective view showing the measurement apparatus using the feeding arm with a coaxial cable.

As shown in FIG. 18, the feeding arm 107 may be a structure including coaxial cable 172 along an arm 171 which is made of plastic. Production cost can be reduced by using the coaxial cable 172 as the transmission line, compared with using a waveguide as the feeding arm 107 which requires metal processing with high precision. Moreover, the distance between the measuring antenna 108 and the measured antenna 109 can easily vary by preparing several arms 171 which have different length.

When the feeding arm 107 uses the coaxial cable 172 as the transmission line, a rotary joint is useful to connect the coaxial cables 172 inside and outside the anechoic chamber 101.

The feeding arm 107 may be covered with the radio wave absorber as same as inside of the anechoic chamber 101. The rotation units 104-106 which are not connected to the feeding arm 107 may also be covered with the radio wave absorber. The probe hold 103 may also be covered with the radio wave absorber.

Figure 19:
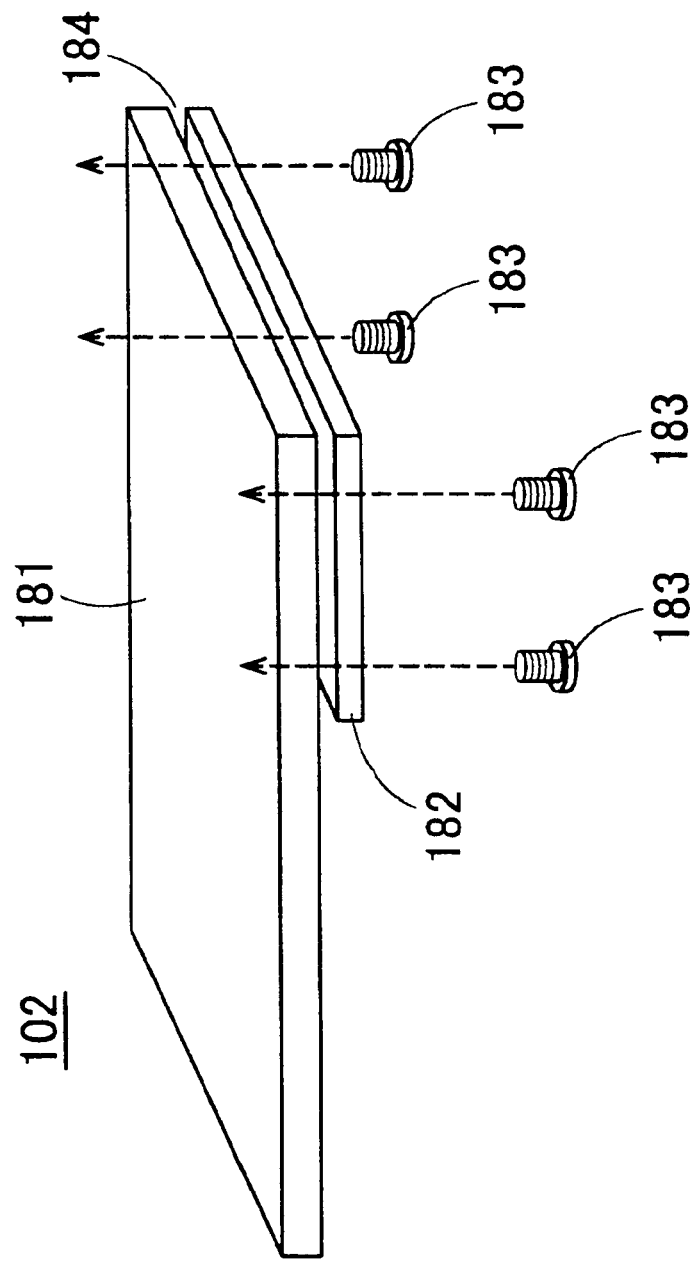
FIG. 19 is a perspective view showing a DUT board.

As shown in FIG. 19, the DUT board 102 may include a main plate 181, a sub plate 182, and a plastic screw 183. A substrate (not shown) including the measured antenna 109 is inserted into a slit 184 which is formed between the main plate 181 and the sub plate 182. Then, the substrate is fixed by the plastic screw 183. This structure realizes longer distance between the DUT board 102 and the measured antenna 109 compared with the case that the measured antenna 109 is placed on the DUT board 102. Therefore, influence due to scattered wave from the DUT board 102 can be reduced.

The DUT board 102 is not covered with the radio wave absorber, because it is close to the measured antenna 109. Therefore, the DUT board 102 may be made of a material having low relative permittivity such as Teflon (Registered Trademark) in order to reduce the influence due to scattered wave from the DUT board 102.

In above description, a signal is transmitted from the measuring antenna 108 which is fixed to the tip of the feeding arm 107 to the measured antenna 109 which is fixed on the DUT board 102. Inversely, the signal may be transmitted from the measured antenna 109 to the measuring antenna 108.

(Description of the Second Embodiment)

Figure 20:
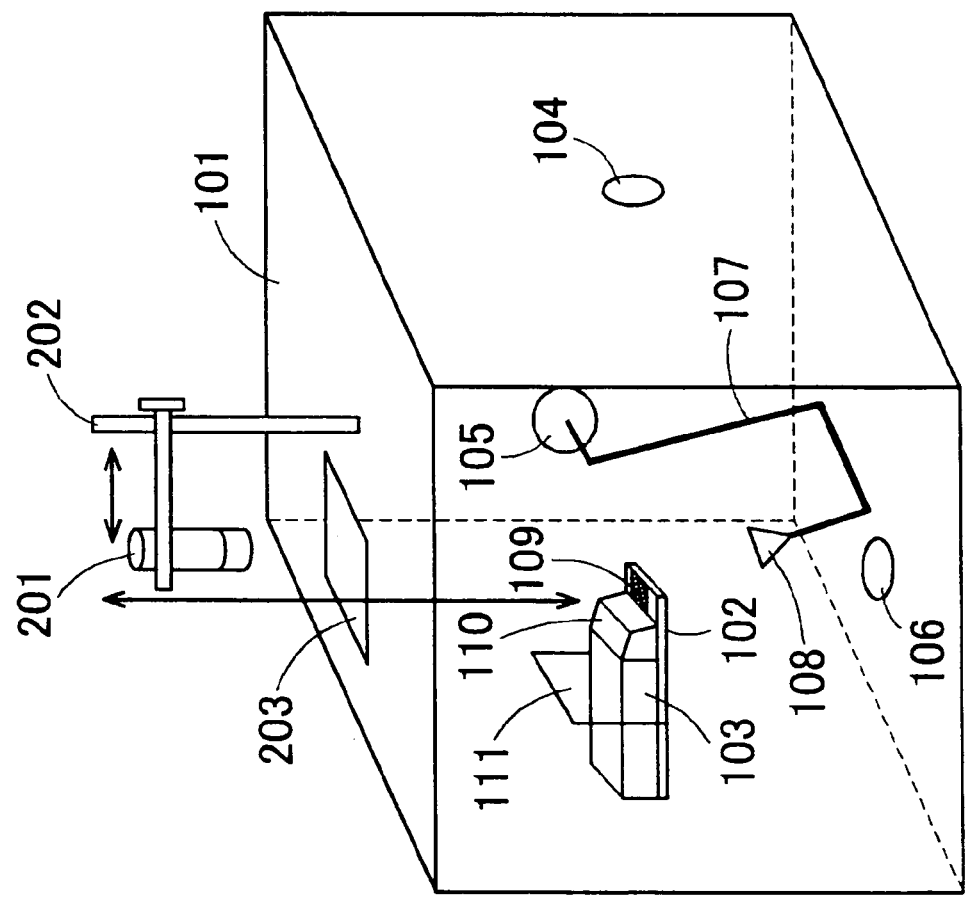
FIG. 20 is a perspective view showing a measurement apparatus according to the second embodiment.

As shown in FIG. 20, a measurement apparatus is almost same as that of the first embodiment except that it further includes a microscope 201 and a support unit 202. The support unit 202 supports the microscope 201. The support unit 202 includes a shifting unit in order to shift the microscope 201 in a vertical direction. The sifting unit performs micro adjustment or coarse adjustment about how long the microscope 201 is shifted. The support unit 202 may include the shifting unit in order to shift the microscope 201 in a horizontal direction.

An aperture 203 is opened in top of the anechoic chamber 101 in order to set the microscope 201 inside the anechoic chamber 101. The aperture 203 is formed above the measured antenna 109 placed on the DUT board 102.

Other else components (except for the microscope 201, the support unit 202 and the aperture 203) are same as them of the first embodiment. Therefore, explanations about them are skipped.

The microscope 201 is used to see whether the needles along the tip of the probe 110 touch the contact pad formed on the semiconductor chip including the measured antenna 109. The microscope 201 is connected to a monitor (not shown) outside the anechoic chamber 101. Images from the microscope 201 are displayed on the monitor. An operator can see touching condition of the probe 110 by the monitor.

In general, focal length of the microscope 201 is about several [mm] to several dozen [mm]. The microscope 201 is set inside the anechoic chamber 101 through the aperture 203 and focus of the microscope 201 is adjusted by the support unit 202.

Labor effectiveness is improved by performing contact the needles along the tip of the probe 110 to the contact pad with watching the monitor.

The microscope 201 is evacuated to outside the anechoic chamber 101 and the aperture 203 is closed during measurement of the radiation properties of the measured antenna 109. This avoids generating scattered waves by the microscope 201 and happening a collision of the microscope 201 and the feeding arm 107.

According to the second embodiment, the measurement apparatus can easily measure the radiation properties for the plural of panes with keeping fixed in the anechoic chamber. Moreover, the measurement apparatus improves labor effectiveness in the performing contact the needles along the tip of the probe 110 to the contact pad.

The measurement apparatus of the first. or second embodiment may be used to measure not only the radiation property of an antenna but also electromagnetic noise.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A measurement apparatus, comprising:
an anechoic chamber having a plurality of inner-wails, each being covered with a radio wave absorber, one of the inner-walls being a first wall with an aperture and the other inner-walls being second walls;
a DUT (Device Under Test) board to hold a first antenna to be measured with radiation property and a probe to detect a signal from the first antenna, at least a part of the DUT board being inserted into the anechoic chamber through the aperture in the first wall;
a feeding arm, one end holding a second antenna radiating a radio wave to the first antenna in the anechoic chamber; and
a plurality of rotation units, each provided on each of the second walls and being selectively attached to the other end of the feeding arm for rotating the second antenna and for feeding to the second antenna.

2. The measurement apparatus of claim 1, wherein the feeding arm is crank-shape.

3. The measurement apparatus of claim 1, wherein the feeding arm is formed by a waveguide.

4. The measurement apparatus of claim 3, wherein
the feeding arm includes a first waveguide and a second waveguide,
one end of the first waveguide being selectively attached to the rotation units,
one end of the second waveguide being attached to and removed from the other end of the first waveguide,
the other end of the second waveguide being attached to and removed from the second antenna, and the second waveguide being shorter than the first waveguide.

5. The measurement apparatus of claim 4, wherein
the second waveguide is a straight waveguide or a 90-degree twist waveguide.

6. The measurement apparatus of claim 3, further comprising:
a coaxial waveguide transformer which is fixed to each of the rotation units, connecting the feeding arm with a coaxial cable of outside the anechoic chamber.

7. The measurement apparatus of claim 3, further comprising:
a supporting member which is able to be fixed to each of the rotation units, supporting the feeding arm.

8. The measurement apparatus of claim 1, further comprising:
a rotary joint which is fixed to each of the rotation units, connecting the feeding arm with a transmission line of outside the anechoic chamber.

9. The measurement apparatus of claim 1, wherein
the feeding arm includes an arm and a coaxial cable, the arm being made of plastic, the coaxial cable being along the arm and being connected to the second antenna.

10. The measurement apparatus of claim 9, further comprising:
a rotary joint which is fixed to each of the rotation units, connecting the coaxial cable inside and outside the anechoic chamber.

11. The measurement apparatus of claim 1, further comprising:
a rotary joint connecting the other end of the feeding arm with the second antenna.

12. The measurement apparatus of claim 1, wherein
the DUT (Device Under Test) board has a slit into which a side of a substrate is inserted, the first antenna being implemented on the substrate.

13. The measurement apparatus of claim 1, further comprising:
a microscope which is set to inside and removed to outside the anechoic chamber through a second aperture, the second aperture being opened in one of the second walls, the second aperture being able to be opened and closed.

14. method for a measurement apparatus including
an anechoic chamber having a plurality of inner-walls, each being covered with a radio wave absorber, one of the inner-walls being a firstwall with an aperture and the other inner-walls being second walls;
a DUT (Device Under Test) board to hold a first antenna to be measured with radiation property and a probe to detect a signal from the first antenna, at least a part of the DUT board being inserted into the anechoic chamber, through the aperture opened in the first wall;
a feeding arm, one end holding a second antenna radiating a radio wave to the first antenna in the anechoic chamber; and
a plurality of rotation units, each provided on each of the second walls and being selectively attached to the other end of the feeding arm for rotating the second antenna and for feeding to the second antenna,
the method comprising:
setting a first antenna on the DUT board;
setting a second antenna on the other end of the feeding arm;
attaching the one end of the feeding arm into a first rotation unit;
touching the probe to the first antenna;
transmitting a signal from the second antenna with rotating the first rotation unit;
receiving the signal at the first antenna;
attaching the one end of the feeding arm into a second rotation unit;
transmitting the signal from the second antenna with rotating the second rotation unit; and
receiving the signal at the first antenna.

* * * * *